(12) United States Patent
Totani et al.

(10) Patent No.: US 6,282,098 B1
(45) Date of Patent: Aug. 28, 2001

(54) ELECTRONIC CIRCUIT MODULE, ELECTRONIC CIRCUIT MODULE CONNECTING STRUCTURE AND CONNECTING MEMBER, AND METHOD FOR CONNECTING THE SAME

(75) Inventors: Makoto Totani; Yasuhide Kuroda; Masaki Ono; Takayoshi Tanemura; Tetsuya Kiyonaga, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/270,842

(22) Filed: Mar. 18, 1999

(30) Foreign Application Priority Data

Mar. 19, 1998 (JP) .................................. 10-070772

(51) Int. Cl.⁷ ...................................................... H05K 1/14
(52) U.S. Cl. ........................ 361/733; 361/735; 361/789; 361/790; 361/729; 174/250; 174/254; 439/65; 439/928
(58) Field of Search ..................................... 361/733, 735, 361/789, 790, 729; 439/65, 928; 174/250, 254, 117 FF

(56) References Cited

U.S. PATENT DOCUMENTS

| | | | |
|---|---|---|---|
| 5,219,292 | * 6/1993 | Dickirson et al. ..................... 439/67 |
| 5,414,220 | * 5/1995 | Honato et al. ......................... 174/254 |
| 5,742,484 | * 4/1998 | Gillette et al. ........................ 361/789 |
| 5,764,497 | * 6/1998 | Mizumo ................................. 361/803 |
| 5,831,219 | * 11/1998 | Kobayashi et al. ................... 174/261 |
| 5,970,608 | * 10/1999 | Tighe et al. ............................. 29/843 |

FOREIGN PATENT DOCUMENTS 61-131471   6/1986   (JP) .

* cited by examiner

*Primary Examiner*—Jayprakash N. Gandhi
*Assistant Examiner*—David Foster
(74) *Attorney, Agent, or Firm*—Armstrong, Westeman, Hattori, McLeland & Naughton

(57) ABSTRACT

An electronic circuit module has an electronic circuit module main body and two signal pedestals, one on each side of the main body. The first signal pedestal is formed at a level higher than the second signal pedestal by an amount equal to the vertical thickness of the second signal pedestal. Signal lines are formed on a bottom surface of the first signal pedestal and on a top surface of the second signal pedestal. When connected to adjacent electronic circuit modules, the first signal pedestal of the electronic circuit module overlaps a second signal pedestal of one adjacent electronic circuit module, and the second signal pedestal underlaps a first signal pedestal of another adjacent electronic circuit module to electrically connect electronic circuit modules in multiple stages, improving signal connections and reducing the size of the electronic circuit module package.

19 Claims, 16 Drawing Sheets

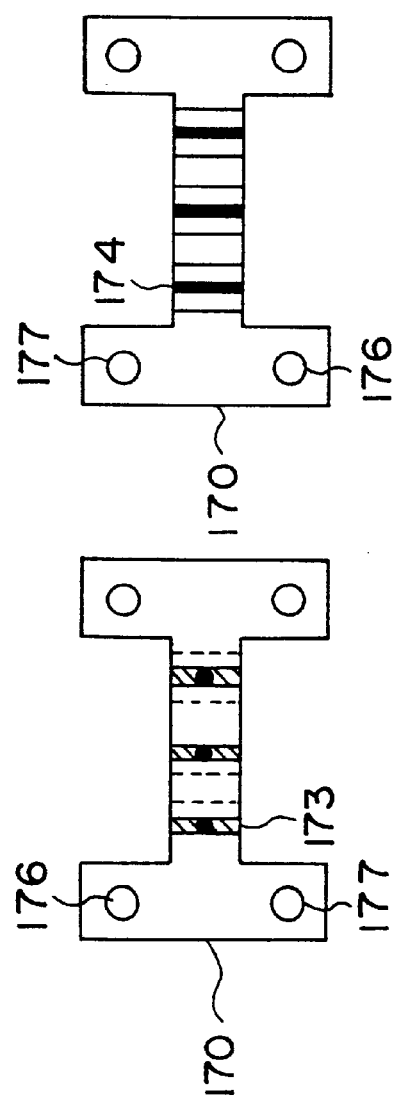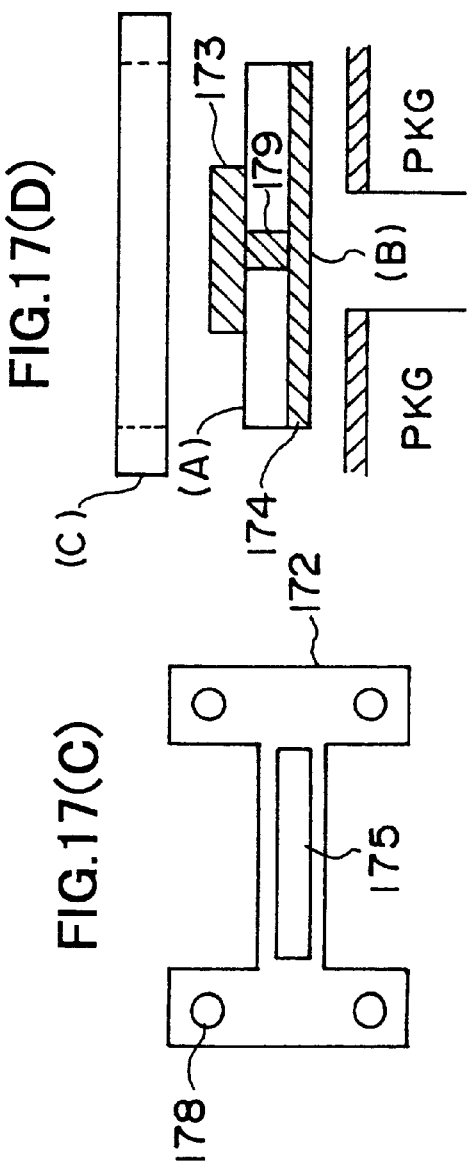

ELECTRONIC CIRCUIT MODULE, ELECTRONIC CIRCUIT MODULE CONNECTING STRUCTURE AND CONNECTING MEMBER, AND METHOD FOR CONNECTING THE SAME

BACKGROUND OF THE INVENTION

1. Field of the Invention

The present invention relates generally to an electronic circuit module, an electronic circuit module connecting structure and connecting member, and a method for connecting same, and more particularly to an electronic circuit module and an electronic circuit module connecting structure and connecting member used in baseband optical transmission and which operates at an operating frequency in the range of several tens of gigaHertz (GHz), and a method for connecting same.

2. Description of the Related Art

In recent years, as the transmission capacity of optical transmission communications systems (hereinafter optical communications systems) has increased there has been a concomitant increase in the transmission speed of such optical communications systems. For example, research into a 40 Gbps transmission speed system device is accelerating at a number of research institutes and communications concerns, and 10 Gbps optical communications systems (hereinafter 10 Gbps systems) are approaching the commercial-use stage.

In the 10 Gbps systems, microwave band technology has been adapted for use with optical modules. Unlike the case with microwave bands, however, these 10 Gbps systems, because they operate at several tens of Gbps, require the characteristics of the amplifier be such as to amplify a broad band of frequencies ranging from several tens of KHz to several tens of GHz. Accordingly, where this technology is used it is necessary to minimize the impedance mismatching that is otherwise not a problem in the microwave band so that amplification characteristics do not deteriorate at the connections between electronic circuit modules connected in multiple stages.

FIG. 1 shows the structure of an O/E (opto-electric converter) module of a typical optical module. The O/E module comprises an optical element 1, an equalizing amplifier 2, a limiter amplifier 3, a discriminator 4, a timing extractor 5, a timing filter 6 and a second limiter amplifier 7. An optical input signal is received by the optical element 1 and data and clock are output by the discriminator 4.

A description will now be given of an operation of the conventional optical module shown in FIG. 1. A weak optical signal is transmitted along the transmission path (an optical fiber), received at the optical element 1 and converted from light to electricity. Undesirable high-frequency noise is deleted by the equalizing amplifier and the signal is then amplified by the limiter amplifier or the AGC (Automatic Gain Control) amplifier to an amplitude capable of being recognized. At the same time, the clock component is extracted by the timing extractor 5 from the output signal of the equalizing amplifier 2. The clock signal is then replayed by the timing filter 6, the timing filter comprising either a SAW (Surface Acoustic Wave) or a dielectric device and amplified to a predetermined amplitude by the second limiter amplifier 7. The discriminator 4 recognizes the "0"s and "1"s of the data signal by using the clock that replayed the data from the limiter amplifier 3 with a timing extraction circuit 8.

Given the scale of density of current integrated circuits (hereinafter ICs or chips), the structure of this circuit in the region of several Gbps typically comprises two or three chips. As previously noted, however, the introduction of microwave technology is required in the region of several Gbps and leads to the following problems.

First, the resonance frequency of the package must be placed outside the signal band, and thus the package itself must be made compact. As a result, the number of functions that can be included in the package is limited.

Second, in order to obtain isolation of the output signal and the input signal, the gain that can be obtained by one package is limited. Otherwise, if the gain is large, then there is a possibility that the isolation will be broken.

At present, the problems described above are solved by dividing the O/E module internal functions among several electronic circuit modules. FIG. 2, for example, is a diagram of the functional structure of a typical optical module in which the O/E internal functions have been divided among several electronic circuit modules. The equalizing amplifiers 21, 22 and 23 of FIG. 2 correspond to the equalizing amplifier 2 of FIG. 1, the differentiation circuit 51 and full wave rectifier circuit 52 of FIG. 2 correspond to the timing extractor 5 of FIG. 1 and the limiter amplifiers 71 through 74 of FIG. 2 correspond to the limiter amplifier 7 of FIG. 1. Of these, the circuit blocks in double outline represent modularized electronic circuit modules (high-speed electrical modules). Except for clock CLK being output from the limiter amplifier 74, the operation of the device shown in FIG. 2 is identical to the operation of the device shown in FIG. 1.

FIG. 3 shows a portion of a structure in which these electronic circuit modules are connected in multiple stages. An electronic circuit module 31 is mounted on an aluminum housing 33, and at least some of the electronic circuit modules are connected to each other and to a connection substrate with gold ribbon bonding 30. At least some of the electronic circuit modules are connected by a high-speed connection substrate. A low-speed substrate 34 is provided on a bottom portion of the aluminum frame 33.

FIG. 4 shows various top, front and side views of the electronic circuit module of FIG. 3 hermetically sealed. The electronic circuit module has a main body 44 to which are attached two pedestals 45, 46, and a power source terminal 43. The two pedestals 45, 46 each have mounting screw holes 42 and signal lines 41, the signal lines positioned atop ceramic terminals 40.

A description will now be given of the problems with the conventional apparatus equipped with the electronic circuit bed above, with reference to FIG. 5 and FIG. 6. In these diagrams, 63 and 83 denote a microstrip line terminal and 64 and 84 denote an aluminum housing.

In the conventional apparatus structure, in order to avoid contact between the electronic circuit modules due to thermal expansion, a gap of approximately 0.2 mm is provided in a signal connecting portion between an electronic circuit module 65 and an adjacent electronic circuit module 65' as shown in FIG. 5 and a gap of approximately 0.2 mm is provided in a signal connecting portion between an electronic circuit module 85 and a connection substrate 82, that is, a microstrip line, as shown in FIG. 6. Additionally, the signal connection between adjacent modules is achieved by bonding a gold ribbon 62, 80 onto the wiring by thermocompression bonding or by a combination of ultrasound and thermocompression bonding.

However, this method of connecting results in a state in which the signal line is removed from the ground, thus generating an impedance mismatching in the signal connecting portion. As a result, the gold ribbon wears out quickly when used by itself to minimize this impedance mismatching.

Additionally, the bonding itself is done at a large number of points and therefore requires many steps to perform as well as a much effort to restrict unevenness in, and ensure uniformity of, the bonding.

Further, the work of assembling the electronic circuit modules into a coherent whole also requires many steps because a large number of electronic circuit modules are used, thus requiring a large number of screw holes to be formed in the aluminum housing and a large number of screws to be used in order to mount the electronic circuit modules.

Additionally, as the circuit scale increases the module size also increases, thus limiting freedom of design.

SUMMARY OF THE INVENTION

Accordingly, it is an object of the present invention to provide an electronic circuit module, an electronic circuit module connecting structure and connecting member, and a method of connecting same, in which the problems described above are eliminated.

The above-described object of the present invention is achieved by an electronic circuit module comprising:

an electronic circuit module main body; and a first signal pedestal provided on a side of said electronic circuit module and a second signal pedestal provided on an opposite side of said electronic circuit module, wherein said first signal pedestal is formed at a level higher than said second signal pedestal by an amount equal to a thickness of said second pedestal.

By forming the first signal pedestal and second signal pedestal at different heights, it becomes possible to connect two adjacent electronic circuit modules directly. As a result, the length of connection between adjacent electronic circuit modules can be shortened and the ribbon bonding used conventionally between electronic circuit modules is no longer required. Further, high-speed signals are conveyed virtually directly, and thus impedance mismatching at the signal connections can be reduced.

Moreover, because two adjacent electronic circuit modules are mounted on the electronic circuit module housing together and thus partially overlap, the number of screws used in the assembly thereof can be reduced by half and the size of the assembled structure can be decreased.

Additionally, the above-described object of the present invention is also achieved by the electronic circuit module as described above, wherein the first signal pedestal and second signal pedestal have screw holes, the screw holes of said first signal pedestal positioned so as to concentrically overlap screw holes of a second signal pedestal of an adjacent electronic circuit module when said first signal line of said first signal pedestal overlaps a second signal line of a second signal pedestal of said adjacent electronic circuit module, and the screw holes of said second signal pedestal positioned so as to concentrically overlap screw holes of a first signal pedestal of an adjacent electronic circuit module when said second signal line of said second signal pedestal overlaps a first signal line of a first signal pedestal of said adjacent electronic circuit module.

By forming and positioning the screw holes as described above, it is possible to fixedly position the two signal lines by tightening a screw.

Additionally, the above-described object of the present invention is also achieved by the electronic circuit module as described above, wherein a metallic bump is provided on a surface of at least one of the first signal line and the second signal line.

By providing a metallic bump on at least one signal line as described above, it is possible to relieve the stress generated at the connections due to differences in the coefficient of thermal expansion of the component members. As a result, it is possible to obtain secure connections between modules.

Further, the above-described object of the present invention is also achieved by the electronic circuit module as described above, wherein a spacer is provided on a surface of a signal line of at least one of said first signal pedestal and said second signal pedestal.

By providing a spacer on at least one of the signal pedestals, it is possible to adjust the height of the metallic bump and thus obtain secure signal connections.

Additionally, the above-described object of the present invention is also achieved by a method for connecting adjacent electronic circuit modules, said method having a signal pedestal on each of two opposing sides of an electronic circuit module, a signal line being provided on an upper surface of each of said signal pedestals, wherein a connecting member for connecting a signal line of a signal pedestal of an electronic circuit module and a signal line of a signal pedestal of an adjacent electronic circuit module straddles said signal lines.

By providing a connecting member connectably straddling the two signal lines of adjacent electronic circuit modules as described above, the ribbon bonding used conventionally is no longer required and it is possible both to shorten the length of connection between adjacent modules and to convey high-speed signals virtually directly. As a result, impedance mismatching at the signal connections can be reduced.

Further, the above-described object of the present invention is also achieved by a connecting structure for connecting adjacent electronic circuit modules, the connecting structure comprising:

a signal pedestal on each of two opposing sides of an electronic circuit module, a signal line being provided on an upper surface of each of the signal pedestals; and a connecting member for connecting a signal line of a signal pedestal of an electronic circuit module and a signal line of a signal pedestal of an adjacent electronic circuit module, the connecting member straddling said signal lines.

By providing a connecting member connectably straddling the two signal lines of adjacent electronic circuit modules as described above, the ribbon bonding used conventionally is no longer required and it is possible both to shorten the length of connection between adjacent modules and to convey high-speed signals virtually directly. As a result, impedance mismatching at the signal connections can be reduced.

Additionally, the above-described object of the present invention is also achieved by the electronic circuit module connecting structure as described above, wherein a connecting portion of either a signal line of a signal pedestal of an electronic circuit module or a signal line of a signal pedestal of an adjacent electronic circuit module for connecting to the connecting member has a metallic bump thereon.

By providing a metallic bump on the connecting portion for connecting to the connecting member as described above, it is possible to relieve the stress generated at the connections due to differences in the coefficient of thermal expansion of the component members and compressively deform the metallic bump. As a result, it is possible to obtain secure connections between modules.

Further, the above-described object of the present invention is also achieved by the electronic circuit module connecting structure described above, the electronic circuit module connecting structure further comprising:

screw holes formed in signal pedestals of an electronic circuit module, signal pedestals of an adjacent electronic circuit module and a housing of the electronic circuit module; and a connection between either a signal line of a signal pedestal of said electronic circuit module or a signal line of a signal pedestal of said adjacent electronic circuit module and said connecting member, wherein the affixing to said electronic circuit module housing of said signal pedestal of said electronic circuit module and said signal pedestal of said adjacent electronic circuit module and said connecting member is accomplished by screws.

By providing the connecting structure described above, it is possible to reduce the number of screw holes and reduce the number of screws to be tightened in order to mount the electronic circuit modules.

Additionally, the above-described object of the present invention is also achieved by the electronic circuit module connecting structure described above, the connecting member comprising:

a ceramic substrate;

a signal line provided on a surface of the ceramic substrate and connected to a signal line of a signal pedestal of an electronic circuit module and a signal line of a signal pedestal of an adjacent electronic circuit module;

a conductor provided on a surface opposite the surface on which the signal line is provided; and a screw hole for connecting a signal line of a signal pedestal of the electronic circuit module and a signal line of a signal pedestal of the adjacent electronic circuit module.

By providing the connecting member described above, the signal lines acquire the function of a microstrip line and stable operation can be achieved.

Further, the above-described object of the present invention is also achieved by the electronic circuit module connecting structure as described above, wherein the connecting member has a notch at a position of a signal line of a signal pedestal of an electronic circuit module and a signal line of a signal pedestal of an adjacent electronic circuit module.

By providing the notch as described above, it is possible to bring a test terminal into contact with the signal line from above, making it possible to test the circuit easily.

Additionally, the above-described object of the present invention is also achieved by the electronic circuit module connecting structure as described above, wherein said connecting member comprises:

a flexible substrate, said substrate having a signal line for connecting signal lines of two electronic circuit modules; and a fixing member for fixably mounting said flexible substrate.

By providing the flexible substrate and the fixing member described above, it is possible to relieve the stress generated at the connections due to differences in the coefficient of thermal expansion of the component members.

Further, the above-described object of the present invention is also achieved by the electronic circuit module connecting structure as described above, wherein the flexible substrate has a test pad provided on a surface opposite a surface on which a signal line is provided and a through hole provided at a position of the signal line of the flexible substrate, the through hole mounting a conductor connecting the test pad and the signal line, the fixing member having a window at a position including the test pad.

By providing the flexible substrate and fixing member as described above, it is possible to bring a test terminal into contact with the signal line from above, making it possible to test the circuit easily.

Additionally, the above-described object of the present invention is also achieved by the electronic circuit module connecting structure as described above, wherein the connecting member comprises installation-use insulator material.

Further, the above-described object of the present invention is also achieved by the connecting member of described above, said connecting member comprising:

a plurality of gold ribbons of a number equal to a number of signal lines of a signal pedestal of an electronic circuit module and a number of signals lines of a signal pedestal of an adjacent electronic circuit module; and screw holes for affixing a signal pedestal of an electronic circuit module to a signal pedestal of an adjacent electronic circuit module.

By providing the connecting member with screw holes as described above, it is possible to ensure that the gold ribbons are aligned atop the signal line without the necessity of positioning the gold ribbon bonding.

Additionally, the above-described object of the present invention is also achieved by the electronic circuit module connecting structure as described above, wherein the connecting member connects adjacent electronic circuit modules and comprises:

a ceramic substrate;

a signal line provided on a surface of the ceramic substrate and connected to a signal line of a signal pedestal of an electronic circuit module and a signal line of a signal pedestal of an adjacent electronic circuit module; and a conductor provided on a surface opposite the surface on which the signal line is provided; and a screw hole for connecting the adjacent electronic circuit modules and the connecting member so as to form a single assembly.

By providing the connecting member described above, it is possible to the signal lines acquire the function of a microstrip line. As a result, stable operation can be achieved.

Further, the above-described object of the present invention is also achieved by the connecting member as described above, wherein the connecting member has a notch at a position of the signal line of the electronic circuit module.

By providing the connecting member with a notch as described above, it is possible to bring a test terminal into contact with the signal line from above, making it possible to test the circuit easily.

By providing the electronic circuit module and the electronic circuit module connecting structure as described above, it is possible to eliminate the impedance mismatching generated at the connection between electronic circuit modules, to eliminate the reduction in working life of the gold ribbon, to reduce the number of steps required to bond the gold ribbon, to reduce the number of screw screws required to mount the electronic circuit modules and to reduce the size of the module for large-scale circuits.

Other objects, features and advantages of the present invention will become more apparent from the following detailed description when read in conjunction with the accompanying drawings.

BRIEF DESCRIPTION OF THE DRAWINGS

FIGS. 17(A), 17(B), 17(C) and 17(D) are diagrams of a structure of a third embodiment of a connecting member according to the present invention;

DESCRIPTION OF THE PREFERRED EMBODIMENTS

A detailed description will now be given of a first embodiment of an electronic circuit module and an electronic circuit module connecting structure and connecting member according to the present invention, with reference to FIG. 7 through FIG. 15.

Figure 7:
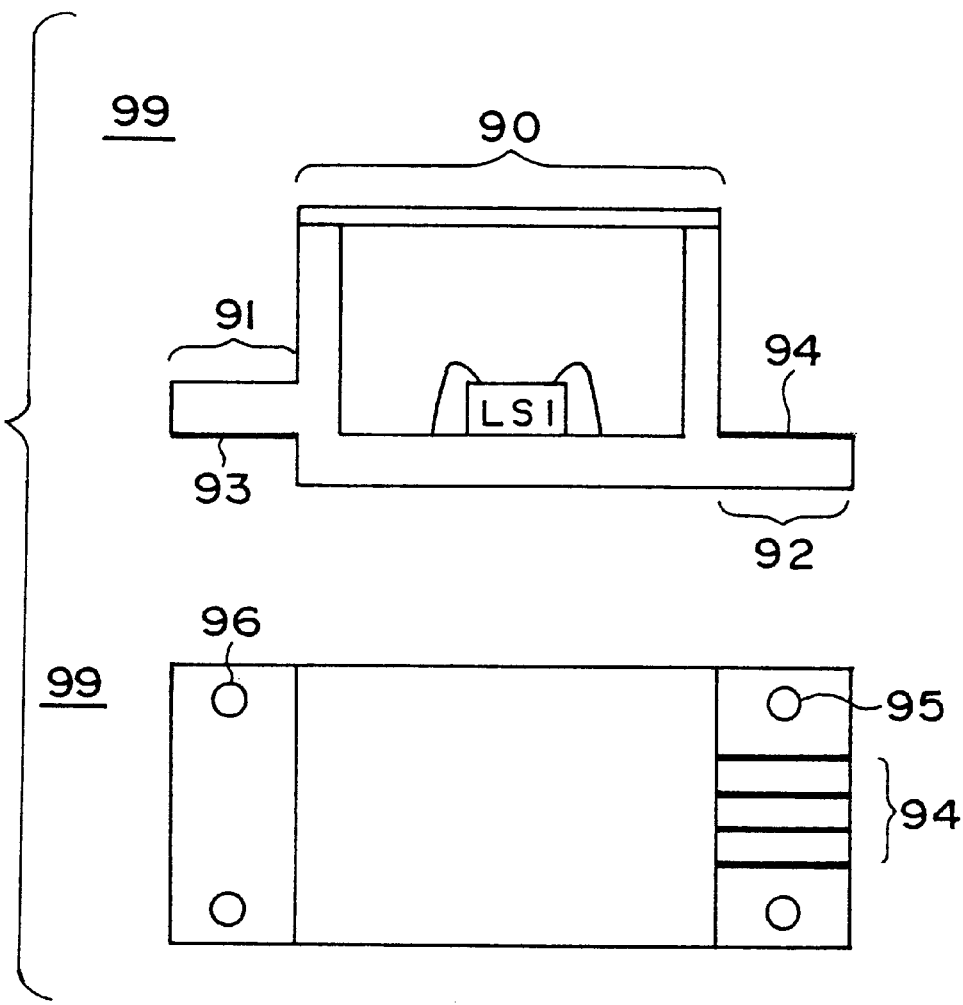
FIG. 7 is a diagram for explaining an embodiment of an electronic circuit module of the present invention.

FIG. 7 shows the electronic circuit module 99, which has two signal pedestals 91, 92. The first signal pedestal 91 is attached to a side of the electronic circuit module main body 90 and the second signal pedestal 92 is attached to an opposing side of the electronic circuit module main body 90. The first signal pedestal 91 is formed on the electronic circuit module main body 90 at a level higher than said second signal pedestal 92 by an amount equal to a vertical thickness of the second pedestal 92. The first signal line 93 is formed on a lower surface of the first signal pedestal 91, and a second signal line 94 is formed on an upper surface of the second signal pedestal 92.

Figure 8:
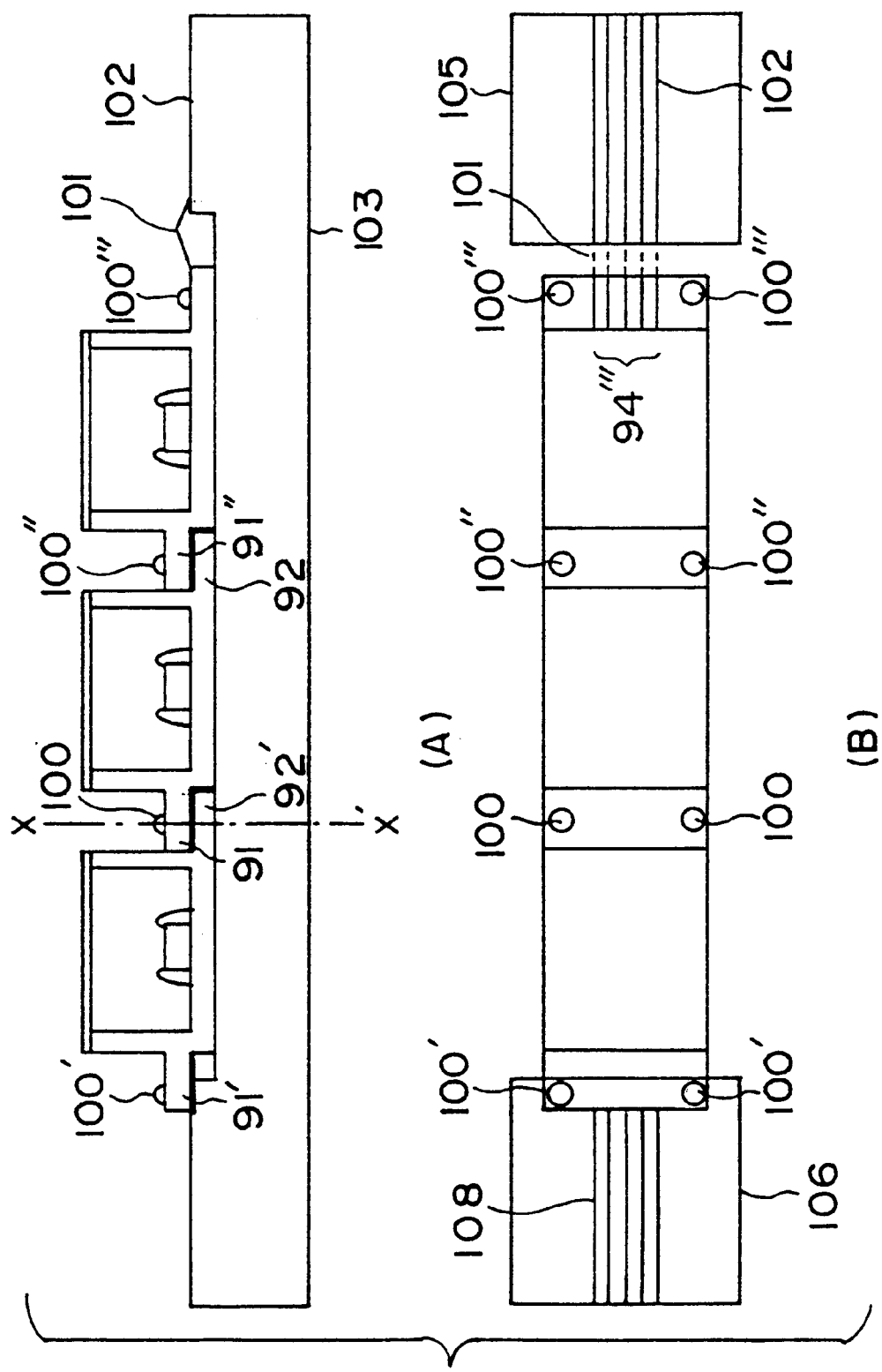
FIG. 8 is a diagram for explaining an installation structure of the electronic circuit module of the present invention.

When loaded in line in an apparatus, the electronic circuit module 99 like the one shown in FIG. 7 is electrically connected as shown in FIG. 8 by overlapping the first signal pedestal 91 of the electronic circuit module 99 with a second signal pedestal 92' of a first adjacent electronic circuit module and overlapping the second signal pedestal 92 of the electronic circuit module 99 with a first signal pedestal 91' of a second adjacent electronic circuit module. In order to connect the electronic circuit modules mechanically as well, the two electronic circuit modules are fixedly mounted on the aluminum housing 103 by passing screws through concentrically positioned screw holes 100 formed on the signal pedestals of the modules.

It should be noted that, at this time, a gap between the mounting surface of the electronic circuit module 99 and the mounting surface of the aluminum frame 103 created when the electronic circuit module 99 is mounted on an aluminum frame 103 is filled in by inserting a solder sheet having a thickness of 0.05 mm to 0.10 mm between the electronic circuit module 99 and the aluminum frame 103. Additionally, a spring washer (not shown) is used on the screw in order to relieve the stress, that is, the mechanical deformation, generated by the tightening of the screw.

It should be noted that, in FIG. 8, 9'" is the second signal line, 101 is the ribbon bonding, and 102 and 108 are signal wires positioned atop the connection substrates 105 and 106.

This method for connecting results in direct connection between the electronic circuit modules, eliminating the need for ribbon bonding conventionally used between electronic circuit modules and shortening the length of connection between adjacent modules.

Additionally, high-speed signals are conveyed virtually directly, and as a result impedance mismatching can be reduced.

Further, because two adjacent electronic circuit modules are together mounted on the electronic circuit module frame at the same time, the number of screws used can be reduced by half, from 4 to 2.

Moreover, because adjacent electronic circuit modules partially overlap the size of the structure in which they are installed can be reduced.

It should be noted that the module terminal pitch is 3.5 mm for adequate accuracy of the screw positioning.

Figure 9:
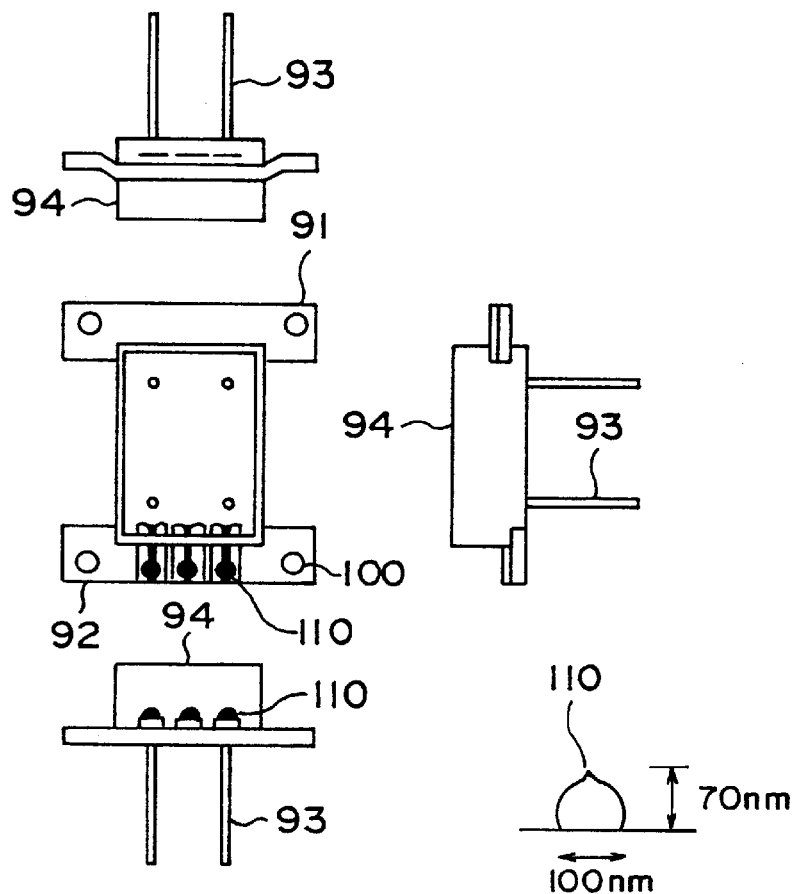
FIG. 9 is a diagram for explaining the structure of the signal connecting portion of the embodiment of the electronic circuit module of the present invention.
Figure 10:
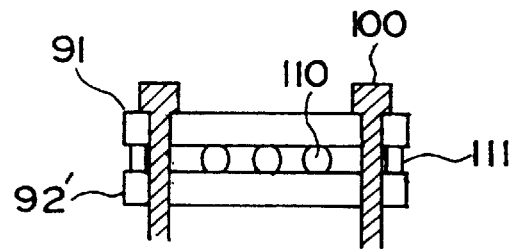
FIG. 10 is a diagram of a cross-sectional view of the connecting portion of an embodiment of the electronic circuit module of the present invention along the line X–X' in FIG. 8.

As shown in FIG. 9, the connection of multiple signal lines comprising an electronic circuit module thick film, that is, a film having a thickness of 5μ or more obtained by either painting, spraying or printing an ink-like paste onto the substrate and then baking the paste thereon, is achieved by a metallic bump formed 110 atop the signal line. The metallic bump may be made of silver. Additionally, as shown in FIG. 10, in order to adjust a height of the metallic bump 110, a spacer 111 made of an insulating metal is inserted between terminals of the electronic circuit modules to be connected. This metallic bump 110 relieves stress generated at the connections by differences in the coefficient of thermal expansion of the component members. This metallic bump 110 is formed to a height of approximately 50 μm to 70 μm. By compressively deforming to approximately the height of the spacer thickness of 30 μm to 50 μm, the metallic bump 110 ensures secure connections between modules.

It is preferable that the material from which the metallic bump 110 is made have as its chief component a metal with strong oxidation-resistant and corrosion-resistant properties. Additionally, by having an identical metal as the chief component of the material forming the surface of the electrode terminals, it is possible to prevent the formation of an alloy between metals due to the presence of different metals and thus improve the reliability of the connections. Further, the higher the purity of the metal used in the metallic bump and the terminal surfaces, the softer the material becomes. Moreover, because the bump size can be made large, for example approximately 100 μm to 150 μm, it is possible to absorb variations in height between electronic circuit modules due to the tolerance of the actual product, thus making it easier to connect the electronic circuit modules.

It should be noted that the need for a solder sheet can also be eliminated by use of this metallic bump.

Figure 19:
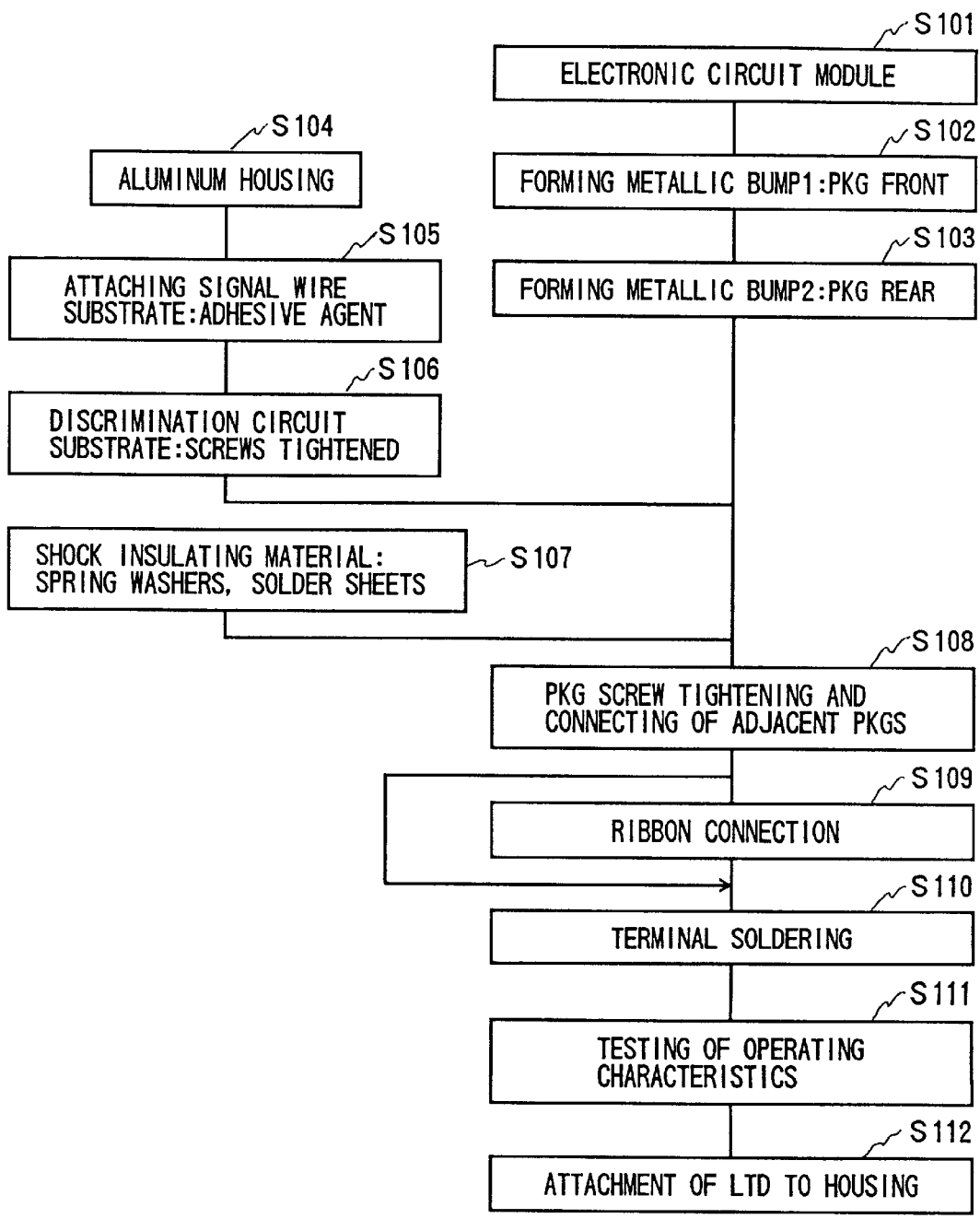
FIG. 19 is a flow chart of steps of a method for connecting a first embodiment of the electronic circuit module connecting structure according to the present invention.

A detailed description will now be given of a method for connecting the electronic circuit module described above, with reference to FIG. 19.

Figure 1:
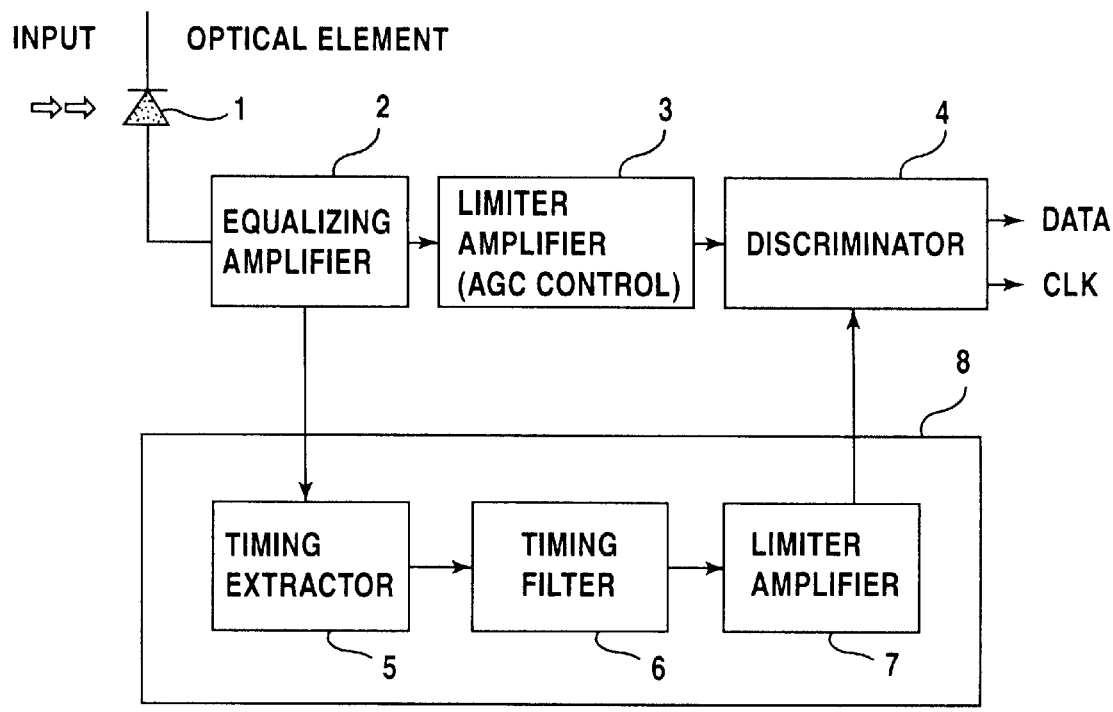
FIG. 1 is a diagram for explaining the structure of a conventional O/E module.
Figure 2:
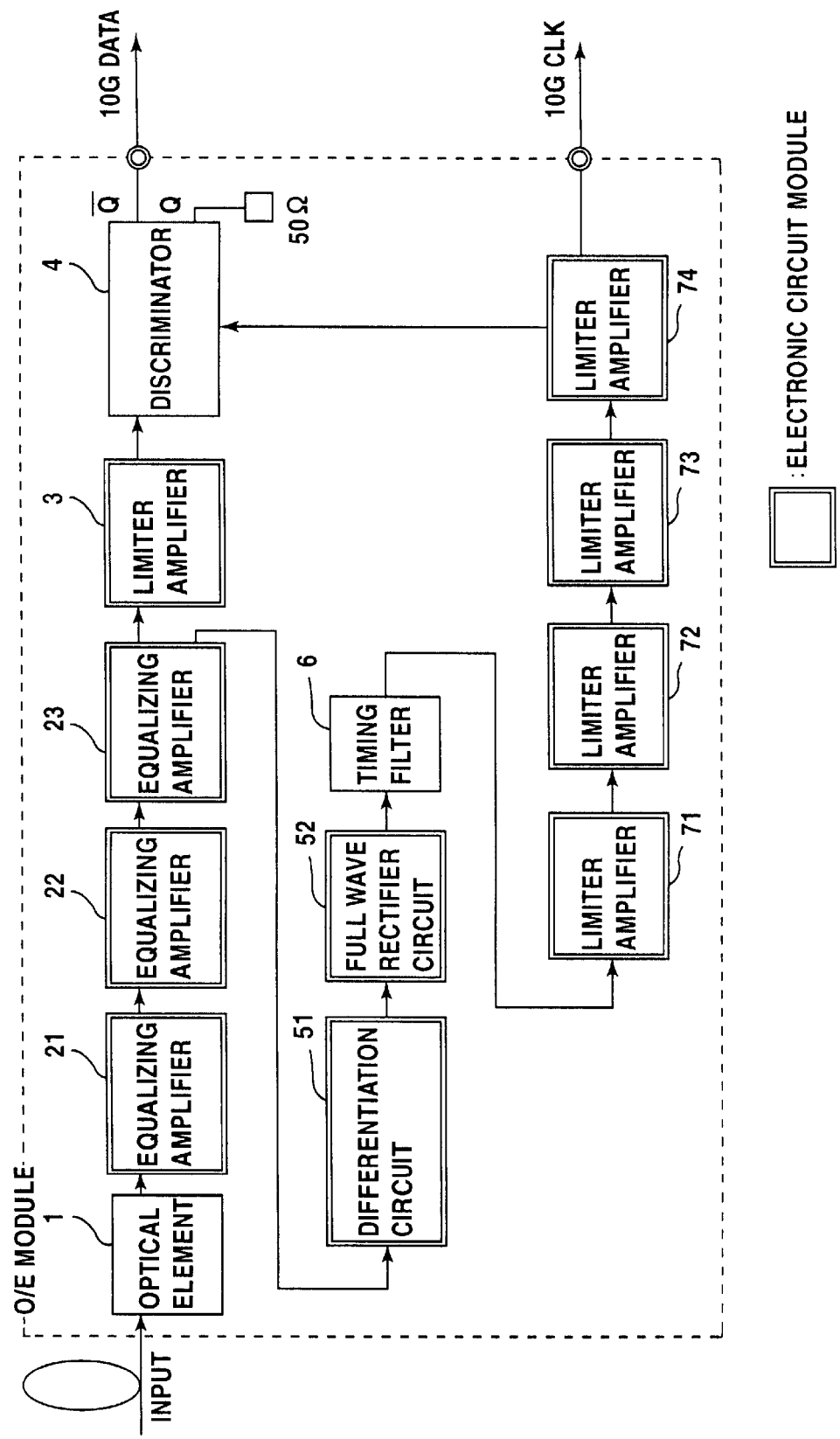
FIG. 2 is a diagram for explaining the functional structure of a typical optical module in which the O/E internal functions have been divided among several electronic circuit modules.
Figure 3:
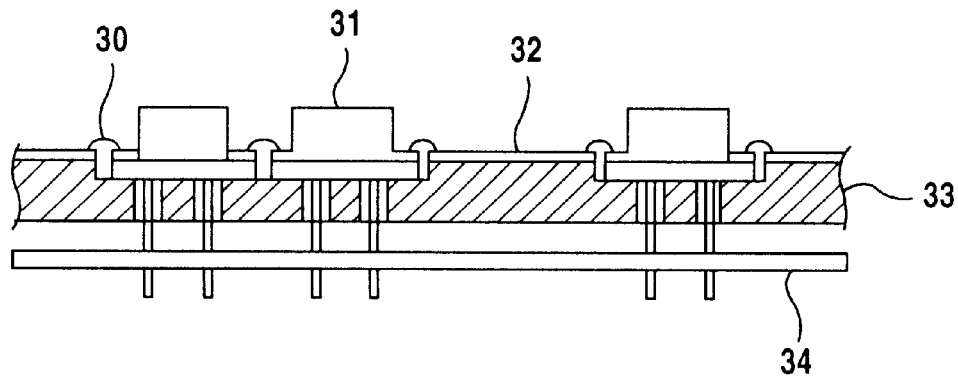
FIG. 3 is a diagram for explaining the conventional configuration of a plurality of electronic circuit modules connected in multiple stages.
Figure 4:
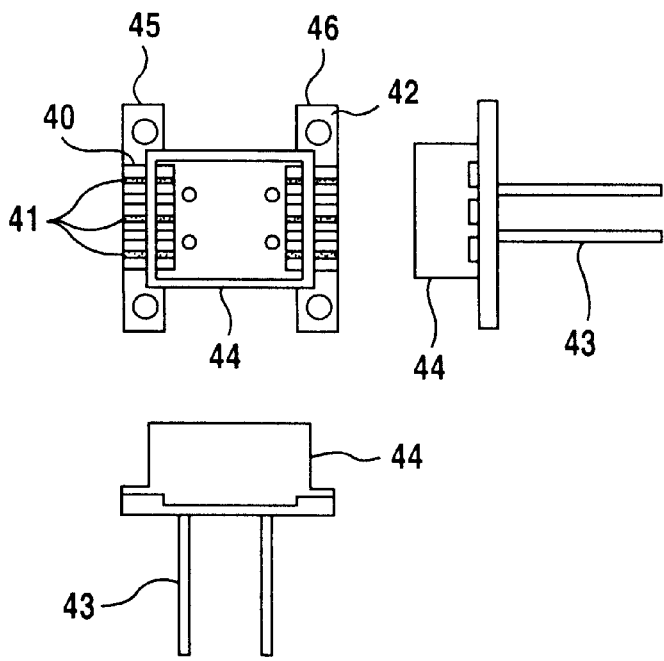
FIG. 4 is a diagram for explaining a conventional electronic circuit module.
Figure 5:
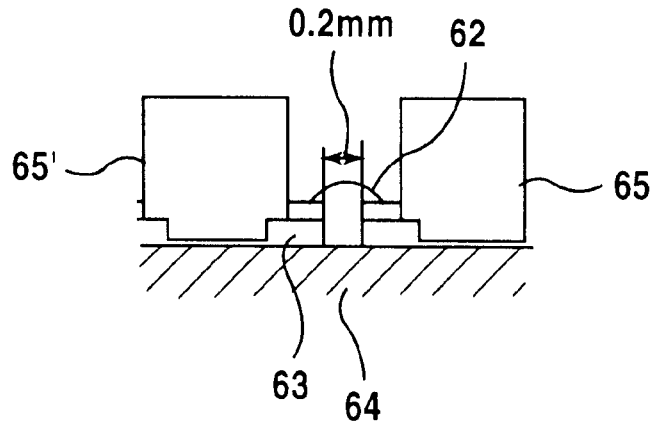
FIG. 5 is a diagram for explaining a signal connecting portion between adjacent electronic circuit modules.
Figure 6:
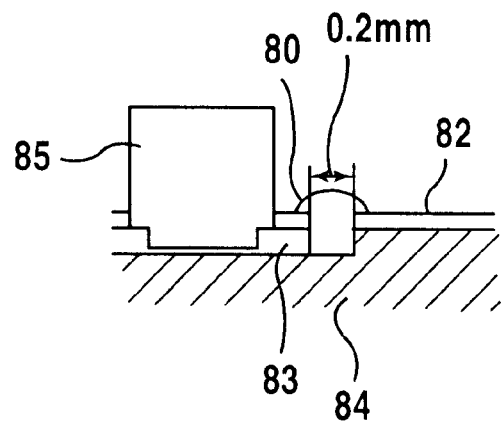
FIG. 6 is a diagram for explaining a signal connecting portion between an electronic circuit module and a connection substrate.

In a step S101, an electronic circuit module package is prepared. In a step S102 a metallic bump is formed on a signal line 93 of the first signal pedestal 91 and in a step S103 a metallic bump is formed on a signal line 94 of the second signal pedestal 92. In a step S104 an aluminum housing 103 is prepared. In a step S105 a substrate for the signal wires 105, 106 is adhesively attached to the connection substrate of the aluminum housing. In a step S106, the discrimination circuit (the discriminator in FIG. 1 and FIG. 2) is mounted on the aluminum housing by using screws. In a step S107, shock-insulating material such as spring washers and solder sheets are inserted. In a step S108, the electronic circuit module package is mounted in place by using screws, an operation which connects adjacent electronic circuit modules to each other. In a step S109, the electronic circuit module 99 and the signal line 94''' are connected by ribbon bonding 101, a step which is not required for connecting the electronic circuit modules to each other. In a step S110, external terminals are connected by soldering. In a step S111, operating characteristics are tested. In a step S112, a lid is attached to the housing, completing the connecting process.

A detailed description will now be given of the operation of an electronic circuit module connecting structure, with reference to FIG. 11.

Figure 11:
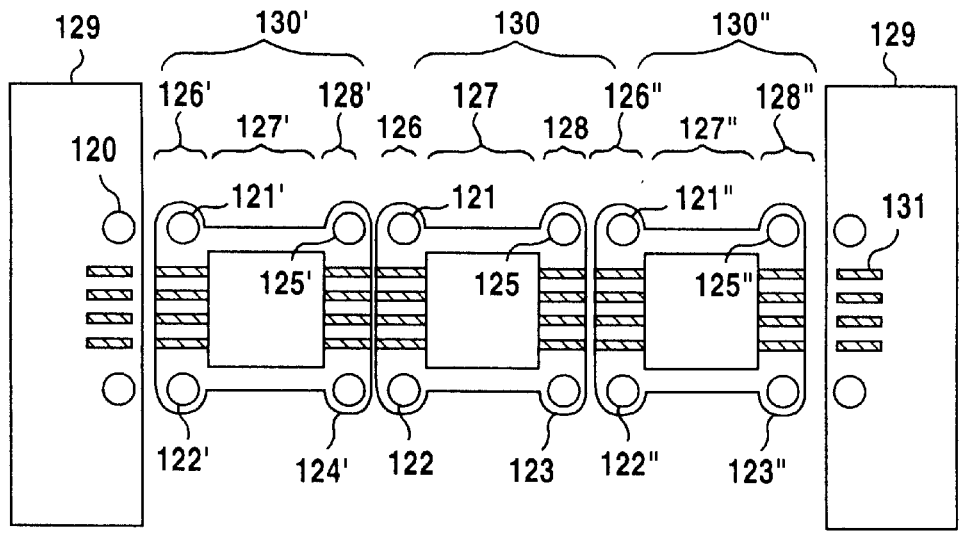
FIG. 11 is a diagram of a state of the electronic circuit module of the present invention prior to connection.

FIG. 11 shows a state of the electronic circuit module of the present invention prior to connection to identical adjacent electronic circuit modules. The connection substrate 129 and electronic circuit modules 130, 130' and 130" are in concatenation. The electronic circuit module 130 has a main body 127 to which two signal pedestals 126, 128 are attached, one on each side thereof. Similarly, electronic circuit module 130', adjacent to and to the left of electronic circuit module 130, also has a main body 127' to which two signal pedestals 126' and 128' are attached, one on each side thereof. Similarly, electronic circuit module 130", adjacent to and to the right of electronic circuit module 130, also has a main body 127" to which two signal pedestals 126" and 128" are attached, one on each side thereof.

Each of the electronic circuit modules 130, 130' and 130" has four screw holes, 121–124, 121'–124' and 121"–124", respectively. Additionally, each signal pedestal 126 and 128, 126' and 128', and 126" and 128" has a signal line.

Figure 12:
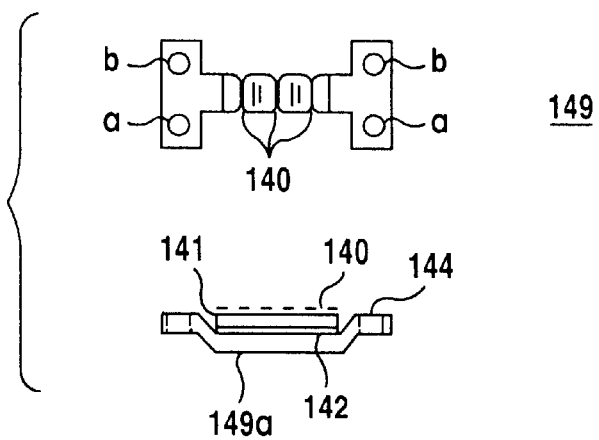
FIG. 12 is a diagram for explaining the structure of a first embodiment of a connecting member according to the present invention.

FIG. 12 shows the structure of the connecting member for connecting the electronic circuit modules of the present invention. The connecting member 149 comprises a metallic plate 149a onto which a ceramic substrate 141 is adhesively attached. Signal lines 140 are provided on the ceramic substrate 141. A conductor 142 is provided across an entire back surface of the ceramic substrate 141, forming a microstrip line. Additionally, screw holes a, b, c and d are formed in a mounting portion of the connecting member 149 so as to be usable together with the electronic circuit module screw holes to which they correspond, that is, screw holes 121 through 124 shown in FIG. 11.

Figure 13:
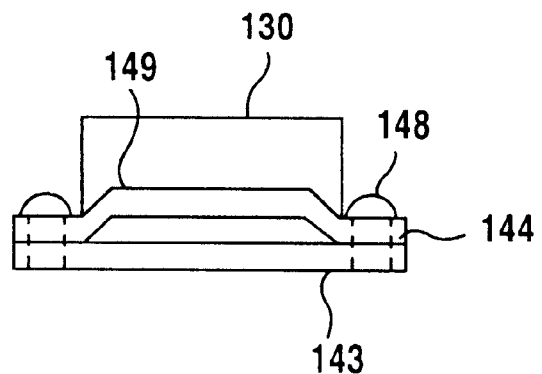
FIG. 13 is a diagram of a connecting structure according to the present invention.

By connecting, for example, signal pedestal 126 of FIG. 11 and signal pedestal 128' of FIG. 11 with the connecting member 149 shown in FIG. 12, the signal line of electronic circuit module 130 and the signal line of electronic circuit module 130' are connected. This connected state is shown in FIG. 13, in which the connecting member 149 and the signal pedestal 143 of the electronic circuit module 130 are connected by inserting and tightening a screw 148 in the screw hole 144. It should be noted that at this time the signal lines of two adjacent electronic circuit modules are also connected by this operation.

By connecting adjacent electronic circuit modules as described above, the need for the ribbon bonding conventionally used is eliminated, making it possible to convey high-speed signals virtually directly and thus making it possible to reduce impedance mismatching.

Figure 14:
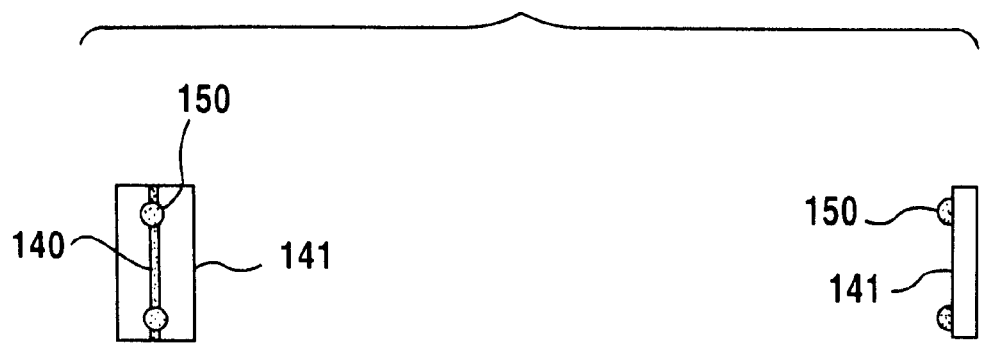
FIG. 14 is a diagram of a protruding portion of the connecting member of the present invention.

FIG. 14 shows a metallic bump 150 provided on the connecting member. The metallic bump 150 is formed atop the signal line 140 of the connecting member for connecting the signal lines of signal pedestals of adjacent electronic circuit modules. The metallic bump 150 is capable of relieving stress generated at the connections due to differences in the coefficient of thermal expansion of the component members. As a result, it is possible to obtain secure connections between modules.

By connecting adjacent electronic circuit modules as described above, the need for the ribbon bonding conventionally used is eliminated and the length of connection between adjacent electronic circuit modules can be shortened, making it possible to convey high-speed signals virtually directly and thus making it possible to reduce impedance mismatching.

Figure 15:
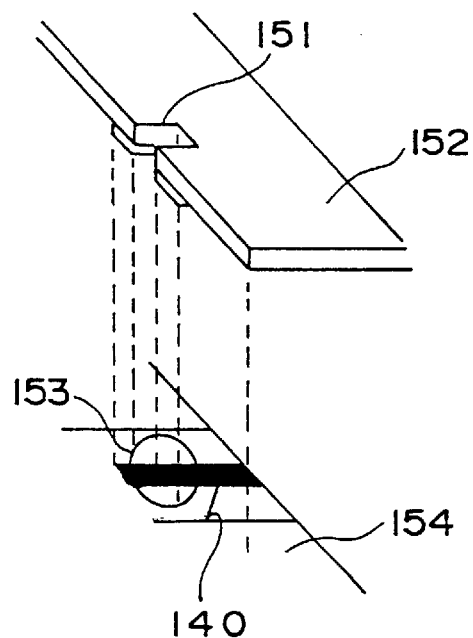
FIG. 15 is a diagram of a notch portion of a connecting member according to the present invention.

FIG. 15 is a diagram of a notch portion 151 of a connecting member 152 according to the present invention. As shown in the FIG. 15, the notch is provided so as to make the signal line 140 atop the signal pedestal 154 visible and to allow a test terminal to be brought into contact with the signal line 140 from above.

Figure 16:
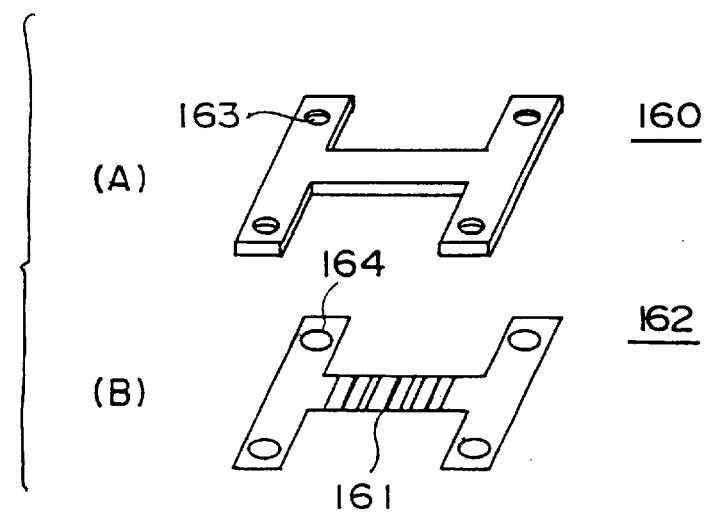
FIG. 16 is a diagram of a structure of a second embodiment of a connecting member according to the present invention.

FIG. 16 is a diagram of a structure of a second embodiment of a connecting member according to the present invention. Said second embodiment of a connecting member for connecting adjacent electronic circuit modules comprises a flexible substrate 162 composed of a polyimide material, and a metallic member 160 for fixedly mounting the flexible substrate 162. A signal line for connecting adjacent electronic circuit modules is provided on the flexible substrate 162. Screw holes 163, 164 are provided on the metallic member 160 and the flexible substrate 162, respectively, and the flexible substrate 162 and the metallic member 160 are attached to the signal pedestal by using screws.

The second embodiment of a connecting member according to the present invention as described above makes it possible to relieve the stress generated at the connections due to differences in the coefficient of thermal expansion of the component members. As a result, it is possible to obtain secure connections between modules.

FIGS. 17(A), 17(B), 17(C) and 17(D) are diagrams of a structure of a third embodiment of a connecting member according to the present invention. Said third embodiment of a connecting member for connecting adjacent electronic circuit modules comprises a flexible substrate 170 and a fixing member 172 for fixedly mounting the flexible substrate 170. As with the second embodiment signal line 174 for adjacent electronic circuit modules is provided on the flexible substrate 170 as shown in FIG. 17(B). As shown in FIG. 17(A), a test pad 173 is provided on a surface of the flexible substrate 170 opposite the surface on which the signal line 174 is provided. A through hole 179 is provided on the flexible substrate 170 as shown in FIG. 17(D) so that the signal line 174 communicates with the test pad 173. Additionally, a window 175 is provided on the fixing member 172 at a position of the test pad 173 as shown in FIG. 17(C) so as to permit testing of the signal line 174 from above.

Figure 18:
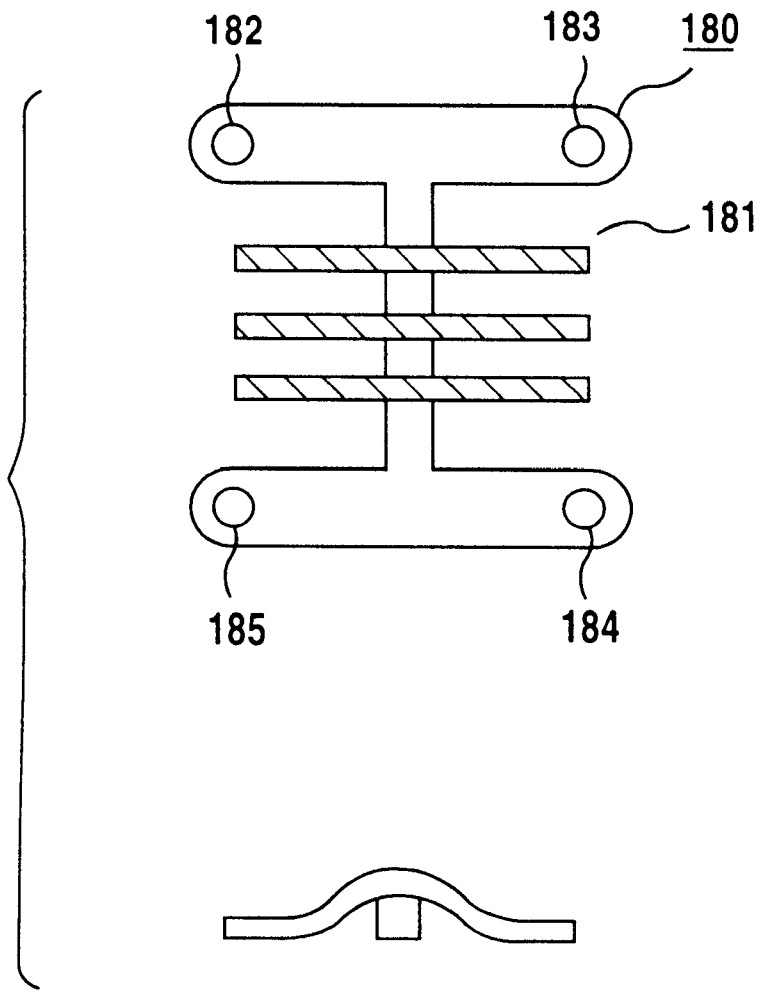
FIG. 18 is a diagram of a structure of a fourth embodiment of a connecting member according to the present invention.

FIG. 18 is a diagram of a structure of a fourth embodiment of a connecting member according to the present invention. Said fourth embodiment of a connecting member for connecting adjacent electronic circuit modules comprises slim support tie-bar leads 181. The leads 181 are composed of a copper material, the surface of the leads 181 being composed of a layer of gold having a thickness of approximately 25 μm. This fourth embodiment of a connecting member has a plurality of gold ribbons equal in number to the number of signal lines of adjacent electronic circuit modules, and is fixedly mounted by installation-use insulator material 180.

Additionally, the installation-use insulator material 180 is provided with screw holes 182, 183, 184 and 185 arranged so that the plurality of gold ribbons are positioned atop the signal lines of the electronic circuit modules. When the installation-use insulator material 180 is fixedly mounted on the electronic circuit module the gold ribbons are positioned at a predetermined position.

A detailed description will now be given for a method of connecting variations of the electronic circuit module connecting structure and connecting member as described above, with reference to FIG. 20, FIG. 21 and FIG. 22.

Figure 20:
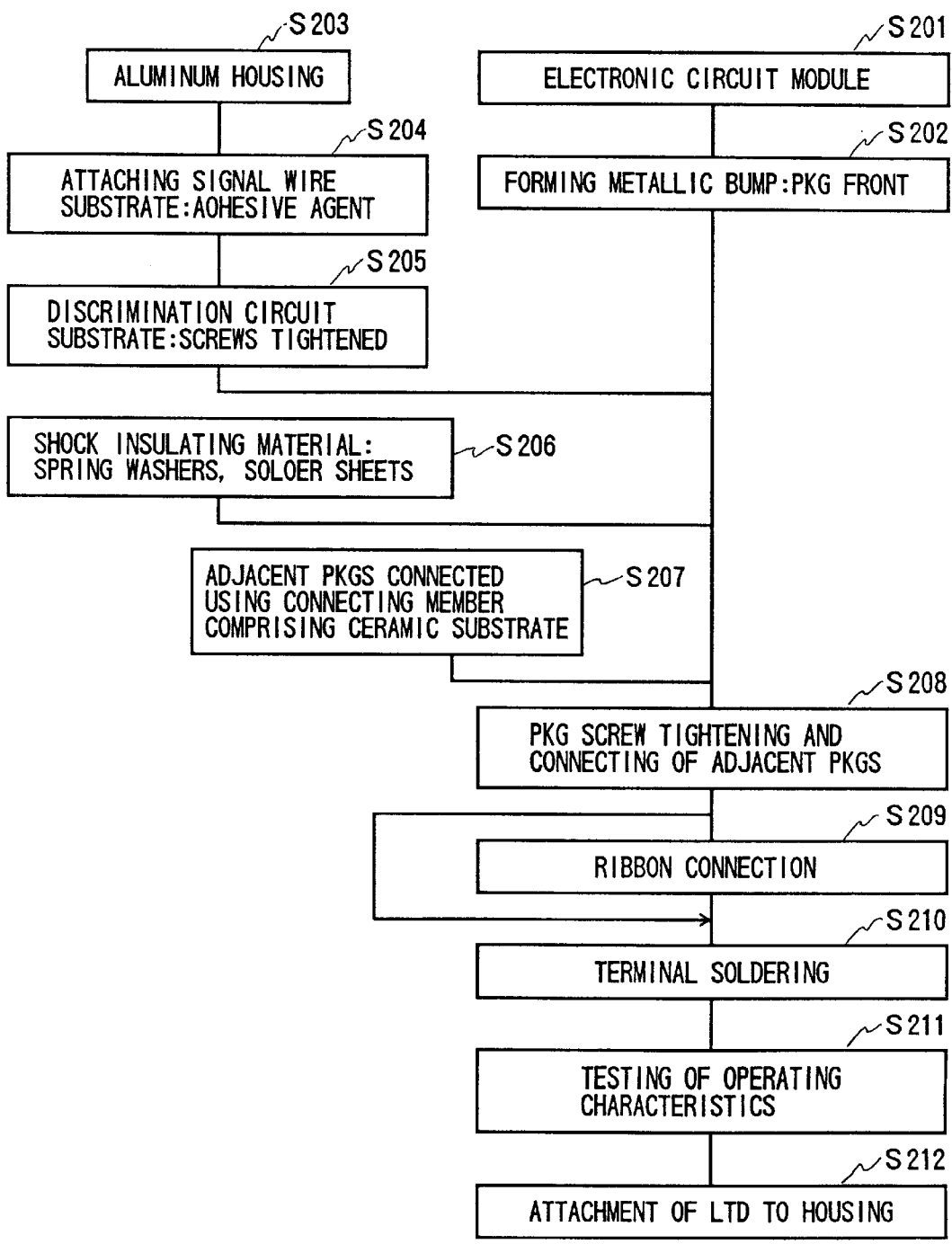
FIG. 20 is a flow chart of steps of a method for connecting a second embodiment of the electronic circuit module connecting structure according to the present invention.

FIG. 20 is a flow chart of steps of a method for connecting a second embodiment of the electronic circuit module connecting structure and connecting member according to the present invention.

In a step S201, an electronic circuit module package 130 is prepared. In a step S202 metallic bumps 150 are formed on signal lines of a first and second signal pedestal 126, 127, respectively. In a step S203 an aluminum housing 103 is prepared. In a step S204 a substrate for the signal wires 105, 106 is adhesively attached to the connection substrate of the aluminum housing 129. In a step S205 a sub-unit discrimination circuit (the discriminator shown in FIG. 1 and FIG. 2) is mounted on the aluminum housing by using screws. In a step S206, shock-insulating material such as spring washers and solder sheets are inserted. In a step S207, adjacent electronic circuit modules 130 are connected using the connecting member 149 comprising the ceramic substrate 141 of the present embodiment. In a step S208, the electronic circuit module package is mounted in place by using screws, an operation which connects adjacent electronic circuit modules to each other. In a step S209, the electronic circuit module 130 and the signal line 131 are connected by ribbon bonding, a step which is not required for connecting the electronic circuit modules to each other. In a step S210, external terminals are connected by soldering. In a step S211, operating characteristics are tested. In a step S212, a lid is attached to the housing, completing the connecting process.

Figure 21:
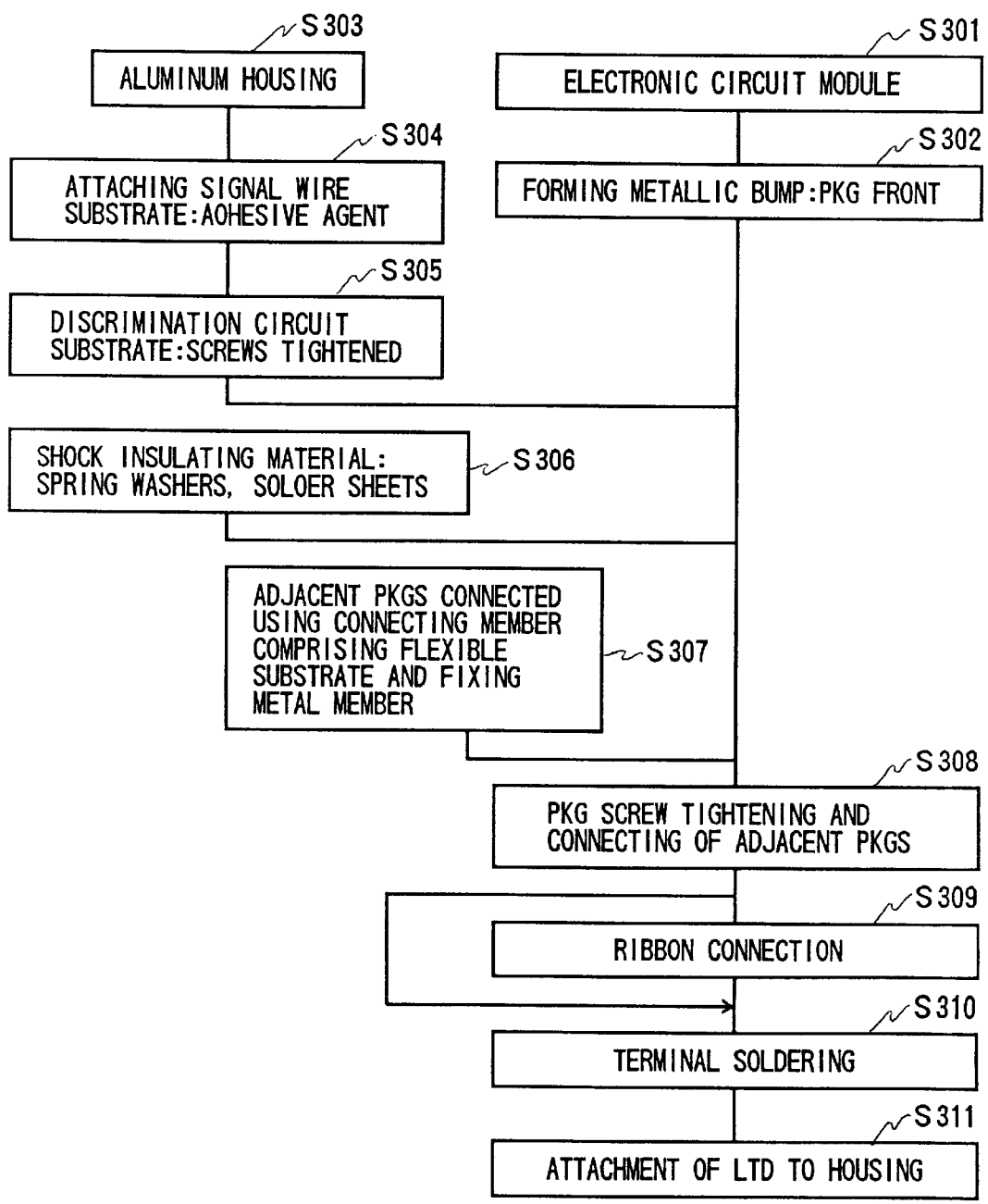
FIG. 21 is a flow chart of steps of a method for connecting a third embodiment of the electronic circuit module connecting structure and connecting member according to the present invention.

FIG. 21 is a flow chart of steps of a method of connecting a third embodiment of the electronic circuit module connecting structure and connecting member according to the present invention.

In a step S301, an electronic circuit module package 130 is prepared. In a step S302 metallic bumps 150 are formed on signal lines of a first and second signal pedestal 126, 127, respectively. In a step S303 an aluminum housing 103 is prepared. In a step S304 a substrate for the signal wires 105, 106 is adhesively attached to the connection substrate 129 of the aluminum housing. In a step S305 a sub-unit discrimination circuit (the discriminator shown in FIG. 1 and FIG. 2) is mounted on the aluminum housing by using screws. In a step S306, shock-insulating material such as spring washers and solder sheets are inserted. In a step S307, adjacent electronic circuit modules 130 are connected using the connecting member comprising the flexible substrate 162 and the fixing metal member 160 of the present embodiment. In a step S308, the electronic circuit module package is mounted in place by using screws, an operation which connects adjacent electronic circuit modules to each other. In a step S309, the electronic circuit module 130 and the signal line 131 are connected by ribbon bonding, a step which is not required for connecting the electronic circuit modules to each other. In a step S310, external terminals are connected by soldering. In a step S311, operating characteristics are tested. In a step S312, a lid is attached to the housing, completing the connecting process.

Figure 22:
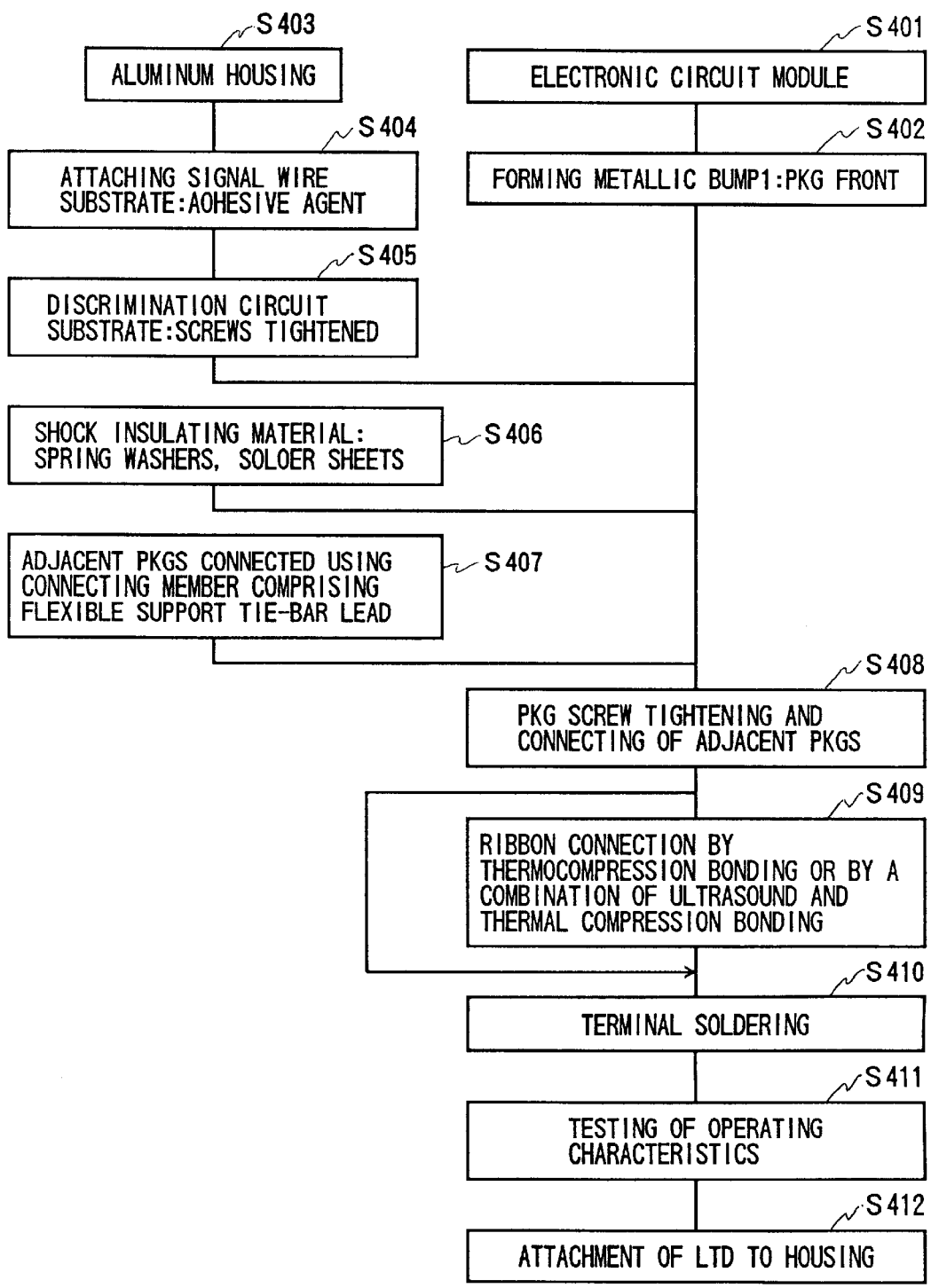
FIG. 22 is a flow chart of steps of a method for connecting a fourth embodiment of the electronic circuit module connecting structure and connecting member according to the present invention.

FIG. 22 is a flow chart of steps of a method of connecting a fourth embodiment of the electronic circuit module connecting structure and connecting member according to the present invention.

In a step S401, an electronic circuit module package 130 is prepared. In a step S402 metallic bumps 150 are formed on signal lines of a first and second signal pedestal 126, 127, respectively. In a step S403 an aluminum housing 103 is prepared. In a step S404 a substrate for the signal wires 105, 106 is adhesively attached to the connection substrate 129 of the aluminum housing. In a step S405 a sub-unit discrimination circuit (the discriminator shown in FIG. 1 and FIG. 2) is mounted on the aluminum housing by using screws. In a step S406, shock-insulating material such as spring washers and solder sheets are inserted. In a step S407, adjacent electronic circuit modules 130 are connected using the connecting member 180 comprising the flexible support tie-bar lead of the present embodiment. In a step S408, the electronic circuit module package is mounted in place by using screws, an operation which connects adjacent electronic circuit modules to each other. In a step S409, the electronic circuit module 130 and the signal line 131 are connected by ribbon bonding, a step which is not required for connecting the electronic circuit modules to each other. In a step S410, external terminals are connected by soldering. In a step S411, operating characteristics are tested. In a step S412, a lid is attached to the housing, completing the connecting process.

The above description is provided in order to enable any person skilled in the art to make and use the invention and sets forth the best mode contemplated by the inventors of carrying out their invention.

The present invention is not limited to the specifically disclosed embodiments, and variations and modifications may be made without departing from the scope of the present invention.

The present application is based on Japanese priority application No. 10-70772 filed on Mar. 19, 1998, the entire contents of which are hereby incorporated by reference.

What is claimed is:

1. An electronic circuit module comprising:

an electronic circuit module main body; and a first signal pedestal provided on a side of said electronic circuit module and a second signal pedestal provided on an opposite side of said electronic circuit module, wherein said first signal pedestal is formed at a level higher than said second signal pedestal by an amount equal to a vertical thickness of said second pedestal.

2. The electronic circuit module as claimed in claim 1, wherein said first signal pedestal has a first signal line formed on a lower surface of said first signal pedestal and said second signal pedestal has a second signal line formed on an upper surface of said second signal pedestal.

3. The electronic circuit module as claimed in claim 1, wherein said first signal pedestal and second signal pedestal have a screw hole, the screw hole of said first signal pedestal positioned so as to concentrically overlap a screw hole of a second signal pedestal of an adjacent electronic circuit module when said first signal line of said first signal pedestal overlaps a second signal line of a second signal pedestal of said adjacent electronic circuit module, and the screw hole of said second signal pedestal positioned so as to concentrically overlap a screw hole of a first signal pedestal of an adjacent electronic circuit module when said second signal line of said second signal pedestal overlaps a first signal line of a first signal pedestal of said adjacent electronic circuit module.

4. The electronic circuit module as claimed in claim 1, wherein a metallic bump is provided on a surface of at least one of said first signal line and said second signal line.

5. The electronic circuit module as claimed in claim 4, wherein a spacer is provided on a surface of a signal line of at least one of said first signal pedestal and said second signal pedestal.

6. A method for connecting adjacent electronic circuit modules, said method having a signal pedestal on each of two opposing sides of an electronic circuit module, a signal line being provided on an upper surface of each of said signal pedestals, wherein a connecting member for connecting a signal line of a signal pedestal of an electronic circuit module and a signal line of a signal pedestal of an adjacent electronic circuit module straddles said signal lines.

7. A connecting structure for connecting adjacent electronic circuit modules, said connecting structure comprising:

a signal pedestal on each of two opposing sides of an electronic circuit module, a signal line being provided on an upper surface of each of said signal pedestals; and a connecting member for connecting a signal line of a signal pedestal of an electronic circuit module and a signal line of a signal pedestal of an adjacent electronic circuit module, said connecting member straddling said signal lines.

8. The electronic circuit module connecting structure as claimed in claim 7, wherein a connecting portion of either a signal line of a signal pedestal of an electronic circuit module or a connecting portion of a signal line of a signal pedestal of an adjacent electronic circuit module for connecting to said connecting member has a metallic bump thereon.

9. The electronic circuit module connecting structure as claimed in claim 7, said electronic circuit module connecting structure further comprising:

screw holes formed in signal pedestals of an electronic circuit module, signal pedestals of an adjacent electronic circuit module and a housing of the electronic circuit module; and a connection between either a signal line of a signal pedestal of said electronic circuit module or a signal line of a signal pedestal of said adjacent electronic circuit module and said connecting member, wherein the affixing to said electronic circuit module housing of said signal pedestal of said electronic circuit module and said signal pedestal of said adjacent electronic circuit module and said connecting member is accomplished by screws.

10. The electronic circuit module connecting structure as claimed in claim 7, wherein said connecting member comprises:

a ceramic substrate;

a signal line provided on a surface of said ceramic substrate and connected to a signal line of a signal pedestal of an electronic circuit module and a signal line of a signal pedestal of an adjacent electronic circuit module;

a conductor provided on a surface opposite the surface on which said signal line is provided; and a screw hole for connecting a signal line of a signal pedestal of said electronic circuit module and a signal line of a signal pedestal of said adjacent electronic circuit module.

11. The electronic circuit module connecting structure as claimed in claim 7, wherein said connecting member has a notch at a position of a signal line of a signal pedestal of said electronic circuit module and a signal line of a signal pedestal of an adjacent electronic circuit module.

12. The electronic circuit module connecting structure as claimed in claim 7, wherein said connecting member comprises:

a flexible substrate, said substrate having a signal line for connecting signal lines of two electronic circuit modules; and a fixing member for fixably mounting said flexible substrate.

13. The electronic circuit module connecting structure as claimed in claim 12, wherein said flexible substrate has a test pad provided on a surface opposite a surface on which a signal line is provided and a through hole provided at a position of said signal line of said flexible substrate, said through hole mounting a conductor connecting said test pad and said signal line, said fixing member having a window at a position including said test pad.

14. The electronic circuit module connecting structure as claimed in claim 7, said connecting member connecting adjacent electronic circuit modules and comprising:

installation-use insulator material;

a plurality of gold ribbons of a number equal to a number of signal lines of a signal pedestal of an electronic circuit module and a number of signals lines of a signal pedestal of an adjacent electronic circuit module; and screw holes for fixedly mounting a signal pedestal of an electronic circuit module to a signal pedestal of an adjacent electronic circuit module in such a way that said plurality of gold ribbons is positioned atop said first signal line of said electronic circuit module and said second signal line of said adjacent electronic circuit module.

15. The electronic circuit module connecting structure as claimed in claim 7, said connecting member connecting adjacent electronic circuit modules and comprising:

a ceramic substrate;

a signal line provided on a surface of said ceramic substrate and connected to a signal line of a signal pedestal of an electronic circuit module and a signal line of a signal pedestal of an adjacent electronic circuit module;

a conductor provided on a surface opposite said surface on which said signal line is provided; and a screw hole for connecting said two adjacent electronic circuit modules and said connecting member so as to form a single assembly.

16. The connecting member as claimed in claim 15, wherein said connecting member has a notch at a position of said signal line of said electronic circuit module.

17. An electronic circuit module connecting member for connecting signal lines of adjacent electronic circuit modules, said connecting member comprising:

a flexible substrate, said substrate having a signal line for connecting signal lines of two electronic circuit modules; and a fixing member for fixably mounting said flexible substrate.

18. The electronic circuit module connecting member as claimed in claim 17, wherein said flexible substrate has a test pad provided on a surface opposite a surface on which a signal line is provided and a through hole provided at a position of said signal line of said flexible substrate, said through hole mounting a conductor connecting said test pad and said signal line, said fixing member having a window at a position including said test pad.

19. An electronic circuit module connecting member for connecting signal lines of adjacent electronic circuit modules, said connecting member comprising:

a plurality of gold ribbons of a number equal to a number of signal lines of a signal pedestal of an electronic circuit module and a number of signals lines of a signal pedestal of an adjacent electronic circuit module; and insulation-use insulator material positioned so that said gold ribbons are positioned atop said signal lines of said adjacent electronic circuit modules.

* * * * *